United States Patent [19]

Fye

[11] Patent Number: 4,840,456

[45] Date of Patent: Jun. 20, 1989

[54] METHODS OF AND APPARATUS FOR GENERATION OF RADIO FREQUENCY SIGNALS

[75] Inventor: Donald M. Fye, Wayland, Mass.

[73] Assignee: GTE Laboratories Incorporated, Waltham, Mass.

[21] Appl. No.: 138,233

[22] Filed: Dec. 28, 1987

[51] Int. Cl.[4] .................. G02B 27/44; H01S 3/082
[52] U.S. Cl. .................. 350/162.17; 372/97; 372/102
[58] Field of Search ................ 372/97, 102; 350/162.17

[56] References Cited

U.S. PATENT DOCUMENTS 3,753,148  8/1973  Billman .................. 372/97
3,840,823 10/1974  Pilloff et al. .............. 372/102
3,857,109 12/1974  Pilloff .................... 372/102

Primary Examiner—Bruce Y. Arnold
Attorney, Agent, or Firm—James J. Cannon, Jr.

[57] ABSTRACT

Electrical signals with frequencies ranging from several tens of megahertz to hundreds of gigahertz are generated by detecting the optical output from a novel double-external-cavity diode laser system. The system provides a convenient means of measuring the frequency response of high speed photodetectors, and it can also be used for the optical generation and transmission of microwave or millimeter wave carriers in applications such as phased array radars.

22 Claims, 1 Drawing Sheet

METHODS OF AND APPARATUS FOR GENERATION OF RADIO FREQUENCY SIGNALS

BACKGROUND OF THE INVENTION

1. Field of the Invention

This invention relates to methods of and apparatus for the generation of radio frequency signals, and, in particular, to those utilizing a double-external-cavity diode laser for the generation of extremely high frequency electrical signals. According, it is a general object of this invention to provide new and improved methods therefore.

2. General Background

Both time domain and frequency domain techniques for characterizing the frequency response of high speed photodetectors have been discussed in the literature.

The time domain method utilizes the illumination of the detector surface with ultrashort light pulses from mode-locked or q-switched lasers, as reported by J. E. Bowers, C. A. Burrus, and R. J. McCoy, "InGaAs PIN Detectors with Modulation Response to Millimeter Wavelengths", *Electron. Lett.* 21 (18), pp. 812-814 (1985), and by P. W. Smith and Y. Silverberg, "Passive Mode-Locking and Short Pulse Formation in Semiconductor Diode Lasers", CLEO'85 *Technical Digest*, paper THC3 (1985), and references therein. Disadvantageously, the application of time-domain techniques requires the use of complicated and expensive laser apparatus that are inconvenient to set up and operate.

The frequency domain methods require either the illumination of the photodetector with the modulated output of a high speed laser or the detection of the beat frequency (difference in optical frequency) between two signals which are combined at the detector surface. Disadvantageously, the use of high speed diode lasers to measure detector response has been limited to electrical bandwidths of less than 20 GHz, and the results were often difficult to interpret, due to uncertainty about the laser modulation characteristics. While the beat frequency technique could be used to generate difference frequencies of hundreds of gigahertz, the realization of this approach, heretofore, has required either the combination of the optical output of two external-cavity single-mode lasers with narrow linewidths, as reported by K. H. Cameron, M. R. Matthews, T. G. Hodgkinson, and W. J. Devlin, "Frequency-Stable Packaged 20-kHz Linewidth 1.5 μm InGaAsP External Cavity Laser Used in an Experimental Heterodyne Optical Fiber System", *CLEO'85 Technical Digest*, paper TUC5 (1985), and references therein, or the utilization of a frequency modulated (FM) sideband injection locking technique with two diode lasers in a master-slave configuration, as reported by L. Goldberg, A. M. Yurek, H. F. Taylor, and J. F. Weller, "35 GHz Microwave Signal Generation with an Injection-Locked Laser Diode", *Electron. Lett.* 21 (18), pp. 814-815 (1985).

OBJECTS AND ADVANTAGES

Other objects of this invention are to avoid the disadvantages of the prior art.

The double-external-cavity diode laser system, in accordance with the invention described herein, utilizes a single diode laser coupled to two external cavities to generate two closely-spaced optical modes with narrow linewidths. As both modes are generated by the same laser, the frequency difference between the modes is more easily controlled and maintained than is the frequency difference between the output of two separate lasers.

The invention described herein is much simpler than prior art two-laser systems and utilizes fewer optical elements.

SUMMARY OF THE INVENTION

In accordance with one aspect of the invention, an extremely high frequency electrical generator includes various elements including means for generating a collimated coherent light beam along a first path. Beam splitting means, oriented along the first path, split the light beam into two components, one of the components being directed along a second path, and the other of the components being directed along a third path. The second and third paths are non-coincident. A first frequency selective element that is oriented along the second path receives the one component and reflects back, along the second path (toward the beam splitting means), light at the wavelength $\lambda_1$. Similarly, a second frequency selective element that is oriented along the third path receives the other component and reflects back (along the third path), light at the wavelength $\lambda_2$. The beam splitting means combines the light at the wavelengths $\lambda_1$ and $\lambda_2$ along a fourth path. A photodetector, oriented along the fourth path, receives light at the wavelength $\lambda_1$ and $\lambda_2$ and provides electrical signals at the wavelength length $|\lambda_1 - \lambda_2|$.

In accordance with certain features of the invention, the means for generating a collimated coherent light beam includes a diode laser. The diode laser can have an antireflective coated end which is adapted to provide emission of light therefrom, with means for collimating the light. A frequency selective element can be a diffraction grating. Further, each frequency selective element can be a respective diffraction grating.

Though the previous paragraphs of this section summarize an aspect of the invention directed to apparatus, it is understood that still another aspect of the invention is directed to the method equivalent.

BRIEF DESCRIPTION OF THE DRAWING

Other objects, advantages, and features of this invention, together with its construction and mode of operation, will become more apparent from the following description, when read in conjunction with the accompanying drawing, in which.

DESCRIPTION OF PREFERRED EMBODIMENT(S)

Figure 1:
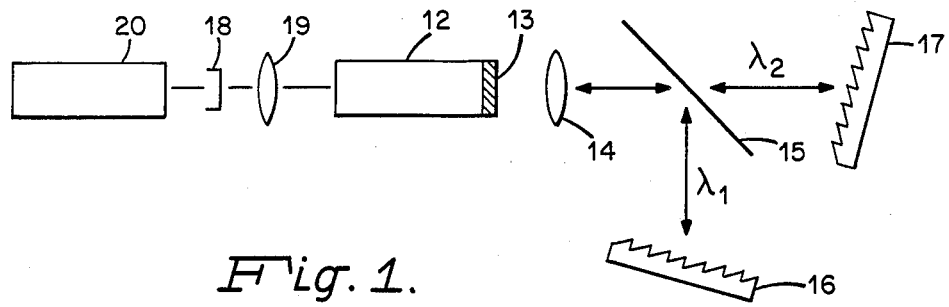
FIG. 1 is a schematic diagram of a double-external-cavity diode laser system configuration for producing two modes at wavelengths $\lambda_1$, and $\lambda_2$, and a beat frequency $|\lambda_1 - \lambda_2|$ therefore, in accordance with one aspect of the invention.
Figure 2:
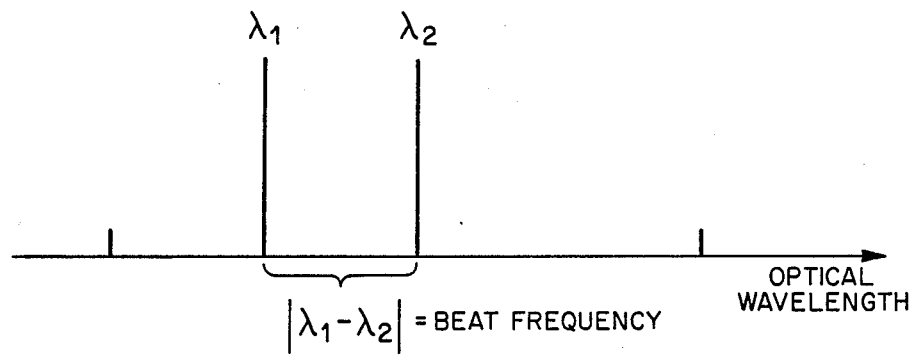
FIG. 2 is a chart of wavelength versus output amplitude of a longitudinal mode structure of a cavity-coupled diode laser, reflecting the beat frequency $|\lambda_1 - \lambda_2|$ that is tuned by rotation of diffraction gratings.

Referring to FIG. 1, there is illustrated a double-external-cavity diode laser system 11 for the generation of radio frequency signals. A diode laser 12, of standard construction, is designed for single-spatial-mode operation. The laser 12 is coated on one end with an antireflective (AR) coating 13 to provide facet reflectivity of less than a few tenths of a percent. Emission of light from the AR-coated facet 13 is collimated by a lens 14, divided by a beamsplitter 15, and reflected from two diffraction gratings 16, 17 (or other frequency selective elements such as suitably blocked Fabry-Perot resonators). The feedback from the two frequency selective elements 16, 17 is combined and refocused into the diode laser 12, so that the output of the diode laser 12 consists of two modes separated by the difference between the wavelengths selected by the frequency selective elements. The use of an extremely low-reflectivity AR coating (such as zirconium dioxide) and strong coupling between the frequency-selective elements 16, 17 and the diode laser 12 prevents the diode laser 12 from oscillating in its natural Fabry-Perot modes. When the gratings 16, 17 are used as frequency selective elements, the wavelengths of the double-external-cavity diode laser 11 modes can be easily tuned by tilting one or both of the gratings 16, 17. The optical output spectrum of the laser 12 will have the appearance shown schematically in FIG. 2, where the residual Fabry-Perot modes are much weaker than the modes established by the external cavities. The laser 12 output can be collected either from the uncoupled laser 12 facet, as depicted in FIG. 1, or from the remaining port of the beamsplitter 15.

Figure 3:
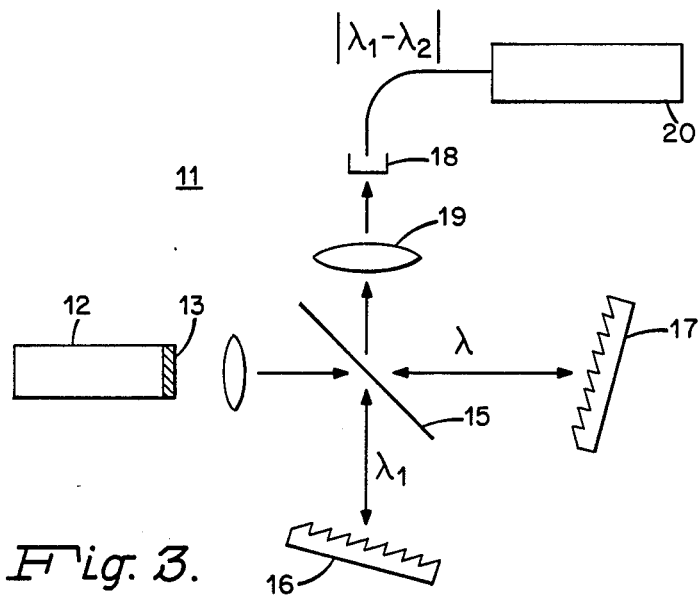
FIG. 3 is a schematic diagram of another configuration, in accordance with another aspect of the invention.

As illustrated in FIG. 3, the collection of the output from the beamsplitter 15 is advantageous because it requires optical access to only one laser facet, and allows for the possibility of coating the uncoupled laser facet with a high reflectivity coating in order to increase the power collected from the beamsplitter 15.

When the output of the laser 12 is focused on a photodetector 18 (via a focusing lens 19) the photodetector 18 current will be modulated at a frequency equal to the difference frequency between two laser modes. Since for a 1.3 μm laser a wavelength difference of 1 Å between the two laser modes corresponds to a frequency of 17.8 GHz, extremely high frequency electrical signals can be generated in the detector 18 by small changes in the optical mode wavelengths. The system 11 described here (FIG. 3) can therefore be used to measure the frequency response of a high speed photodetector 18 by tuning the optical mode wavelengths and observing the difference frequency generated by the detector 18 with an RF spectrum analyzer 20. The optical mode wavelengths are determined by the external frequency selective elements 16, 17, so the difference frequency is relatively insensitive to changes in temperature and/or laser characteristics. Since laser linewidths of 20 kHz have been observed for grating-coupled lasers, as reported by K. H. Cameron et al. supra, excellent frequency resolution can be obtained for characterizing the frequency response of high speed photodetectors.

Other modifications will suggest themselves to those skilled in the art, without departing from the spirit and scope of this invention. For example, the double-external-cavity technique described herein can also be used to optically generate and transmit microwave or millimeter wave carriers for applications such as optical injection-locking of millimeter-wave impatt oscillators and mixing/down-conversion of microwave and millimeter wave signals. Microwave carriers are generated without the use of any high frequency electronics, and they can be easily distributed by low loss fiber optic cable for antenna remoting or phased array radar applications.

What is claimed is:

1. An extremely high frequency electrical generator comprising;
    means for generating a collimated coherent light beam along a first path;
    beam splitting means oriented along said first path for splitting said light beam into two components, one of said components being directed along a second path, and the other of said components being directed along a third path, said second and third paths being non-coincident;
    a first frequency selective element means oriented along said second path for receiving said one component and reflecting back, along said second path, toward said beam splitting means, light at the wavelength $\lambda_1$;
    a second frequency selective element means oriented along said third path for receiving said other component and reflecting back, along said third path, toward said beam splitting means, light at the wavelength $\lambda_2$;
    whereby said beam splitting means combines said light at said wavelengths $\lambda_1$ and $\lambda_2$ along a fourth path; and
    a photodetecting means oriented along said fourth path for receiving light at said wavelengths $\lambda_1$ and $\lambda_2$ and for providing electrical signals at the wavelength, $|\lambda_1 - \lambda_2|$.

2. The generator as recited in claim 1 wherein said means for generating a collimated coherent light beam comprises:
    a diode laser.

3. The generator as recited in claim 2 wherein said diode laser has one end coated with an anti-reflective coating, whereby said coated one end is adapted to provide emission of light therefrom, and
    means for collimating said light.

4. The generator as recited in claim 3 wherein one of said frequency selective element means is a diffraction grating.

5. The generator as recited in claim 4 wherein both of said frequency selective element means are diffraction gratings.

6. The generator as recited in claim 2 wherein one of said frequency selective element means is a diffraction grating.

7. The generator as recited in claim 6 wherein both of said frequency selective element means are diffraction gratings.

8. The generator as recited in claim 1 wherein one of said frequency selective element means is a diffraction grating.

9. The generator as recited in claim 8 wherein both of said frequency selective means are diffraction gratings.

10. The generator as recited in claim 1 wherein all of said paths are independent and non-coincident.

11. The generator as recited in claim 1 wherein said first path and said fourth path are co-aligned.

12. A method of generating extremely high frequency electrical signals comprising the steps of:
    generating a collimated coherent light beam along a first path;
    splitting said beam along said first path into two components, one of said components being directed along a second path, and the other of said components being directed along a third path, said second and third paths being non-coincident;

receiving said one component along said second path and reflecting back, along said second path, a frequency selected wavelength $\lambda_1$;

receiving said other component along said third path and reflecting back, along said third path, a frequency selected wavelength $\lambda_2$, whereby said light at said wavelengths $\lambda_1$ and $\lambda_2$ are combined along a fourth path; and photodetecting light at said wavelengths $\lambda_1$ and $\lambda_2$ along said fourth path, and providing electrical signals at the wavelength $|\lambda_1$ and $\lambda_2|$.

13. The method as recited in claim 12 wherein said light beam is generated by a diode laser.

14. The method as recited in claim 13 wherein said diode laser has a pair of ends, said method further comprising:

coating one of said ends with an anti-reflective coating whereby said coated one end is adapted to provide emission of light therefrom, and collimating said light.

15. The method as recited in claim 14 wherein one of said frequency selected wavelengths is obtained by positioning of a diffraction grating.

16. The method as recited in claim 15 wherein each of said frequency selected wavelengths is obtained by positioning of a respective diffraction grating.

17. The method as recited in claim 13 wherein one of said frequency selected wavelengths is obtained by positioning of a diffraction grating.

18. The method as recited in claim 17 wherein each of said frequency selected wavelengths is obtained by positioning of a respective diffraction grating.

19. The method as recited in claim 12 wherein one of said frequency selected wavelengths is obtained by positioning of a diffraction grating.

20. The method as recited in claim 19 wherein each of said frequency selected wavelengths is obtained by positioning of a respective diffraction grating.

21. The method as recited in claim 12 wherein said paths are independent and non-coincident.

22. The method as recited in claim 12 wherein said first path and said fourth path are co-aligned.

* * * * *